United States Patent
Chung et al.

(10) Patent No.: US 9,754,976 B2
(45) Date of Patent: Sep. 5, 2017

(54) LIQUID CRYSTAL DISPLAY AND ELEMENT SUBSTRATE THEREOF

(71) Applicant: INNOLUX CORPORATION, Chu-Nan, Miao-Li County (TW)

(72) Inventors: Yueh-Ting Chung, Chu-Nan (TW); Shao-Wu Hsu, Chu-Nan (TW); Yung-Hsin Lu, Chu-Nan (TW); Jyun-Yu Chen, Chu-Nan (TW); Kuan-Yu Chiu, Chu-Nan (TW); Chao-Hsiang Wang, Chu-Nan (TW)

(73) Assignee: INNOLUX CORPORATION, Jhu-Nan (TW)

( * ) Notice: Subject to any disclaimer, the term of this patent is extended or adjusted under 35 U.S.C. 154(b) by 170 days.

(21) Appl. No.: 14/533,052

(22) Filed: Nov. 4, 2014

(65) Prior Publication Data

US 2016/0079279 A1     Mar. 17, 2016

(30) Foreign Application Priority Data

Sep. 11, 2014  (TW) .............................. 103131296 A

(51) Int. Cl.
G02F 1/1362 (2006.01)
G02F 1/1343 (2006.01)
H01L 27/12 (2006.01)

(52) U.S. Cl.
CPC ...... *H01L 27/124* (2013.01); *G02F 1/136227* (2013.01); *G02F 2001/134372* (2013.01)

(58) Field of Classification Search
None
See application file for complete search history.

(56) References Cited

U.S. PATENT DOCUMENTS

| | | | |
|---|---|---|---|
| 2005/0062046 A1* | 3/2005 | Kim | G02F 1/13458 257/72 |
| 2006/0113538 A1 | 6/2006 | Kim | |
| 2008/0012139 A1* | 1/2008 | Ryu | G02F 1/136227 257/758 |
| 2010/0283067 A1* | 11/2010 | Murakami | G02F 1/136227 257/88 |
| 2011/0058133 A1 | 3/2011 | Ishigaki et al. | |

(Continued)

FOREIGN PATENT DOCUMENTS

| JP | 2011-059314 | 3/2011 |
|---|---|---|
| KR | 2006-0061169 | 6/2006 |

*Primary Examiner* — Dung Nguyen
*Assistant Examiner* — Shan Liu
(74) *Attorney, Agent, or Firm* — Liu & Liu

(57) ABSTRACT

An element substrate is provided, including a substrate, a metal layer, a planarization layer and a first conductive layer. The metal layer is disposed on the substrate. The planarization layer is located on the metal layer, wherein the planarization layer includes a contact hole, the contact hole has a continuous wall and a bottom, the bottom exposes the metal layer, and the bottom of the contact hole has a first width. The first conductive layer is located on the planarization layer, wherein the first conductive layer includes an opening, the opening exposes the contact hole, and the opening has a second width above the contact hole, wherein the relationship of the first width and the second width is modified to decrease illumination loss and to prevent problems of shot-circuiting and insufficient capacitance.

14 Claims, 7 Drawing Sheets

(56) References Cited

U.S. PATENT DOCUMENTS

| | | | |
|---|---|---|---|
| 2012/0268678 A1* | 10/2012 | Tomioka | G02F 1/133707 349/42 |
| 2014/0367706 A1* | 12/2014 | Park | H01L 27/124 257/88 |
| 2015/0053968 A1* | 2/2015 | Misaki | G02F 1/136227 257/43 |
| 2015/0228665 A1* | 8/2015 | Kim | H01L 27/124 430/5 |
| 2015/0357354 A1* | 12/2015 | Hsu | H01L 29/7869 257/43 |

* cited by examiner

LIQUID CRYSTAL DISPLAY AND ELEMENT SUBSTRATE THEREOF

CROSS REFERENCE TO RELATED APPLICATIONS

This Application claims priority of Taiwan Patent Application No. 103131296, filed on Sep. 11, 2014, the entirety of which is incorporated by reference herein.

BACKGROUND OF THE INVENTION

Field of the Invention

The present invention relates to a liquid crystal display, and in particular to a liquid crystal display having at least one contact hole.

Description of the Related Art

In a liquid crystal display, a contact hole is utilized to conduct a pixel electrode and a source electrode. However, with reference to FIG. 1A, the liquid crystal molecules 2 are arranged along a profile of the contact hole 1, and the contact hole 1 is like a funnel structure.

With reference to FIG. 1B, conventionally, a bottom conductive layer 3 and a pixel conductive layer 4 surround the contact hole. The bottom conductive layer 3 is insulated from the pixel conductive layer 4 by an insulation layer 5. When the radius of the contact hole 1 at the location of the bottom conductive layer 3 is decreased, the bottom conductive layer 3 contacts and short-circuits the pixel conductive layer 4. However, when the radius of the contact hole 1 at the location of the bottom conductive layer 3 is increased, the capacitance between the bottom conductive layer 3 and the pixel conductive layer 4 is insufficient, and the reliability of the liquid crystal display is decreased.

BRIEF SUMMARY OF THE INVENTION

In one embodiment of the invention, an element substrate is provided, including a substrate, a metal layer, a planarization layer and a first conductive layer. The metal layer is disposed on the substrate. The planarization layer is located on the metal layer, wherein the planarization layer comprises a contact hole, the contact hole has a continuous wall and a bottom, the bottom exposes the metal layer, and the bottom of the contact hole has a first width. The first conductive layer is located on the planarization layer, wherein the first conductive layer comprises an opening, the opening exposes the contact hole, and the opening has a second width above the contact hole, wherein the first width and the second width satisfy the following equation:

$$2*\left\{\frac{L_1}{2}+\frac{0.95h}{\ln(0.05)\cdot\tan(1.5\theta)}\cdot\ln\left[\frac{-0.134}{\ln(0.05)\cdot\tan(1.5\theta)}\right]\right\}\le$$
$$L_2\le 2*\left\{\frac{L_1}{2}+\frac{0.95h}{\ln(0.05)\cdot\tan(1.5\theta)}\cdot\ln\left[\frac{-0.00166}{\ln(0.05)\cdot\tan(1.5\theta)}\right]\right\}$$

wherein $L_1$ is the first width, $L_2$ is the second width, h is the thickness of the planarization layer, θ is an included angle between a straight line and an extension surface of the bottom, the straight line connects a reference point and a base point, and the reference point is located on the continuous wall, wherein a vertical distance from the reference point to the bottom is 0.95 h, and the base point is located at the point where the continuous wall is connected to the bottom.

Utilizing the embodiment of the invention, the transmittance loss of the liquid crystal display is less than 1%, which is acceptable for the qualified liquid crystal display, and the problems of short-circuiting and insufficient capacitance between the first conductive layer and the second conductive layer are solved.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
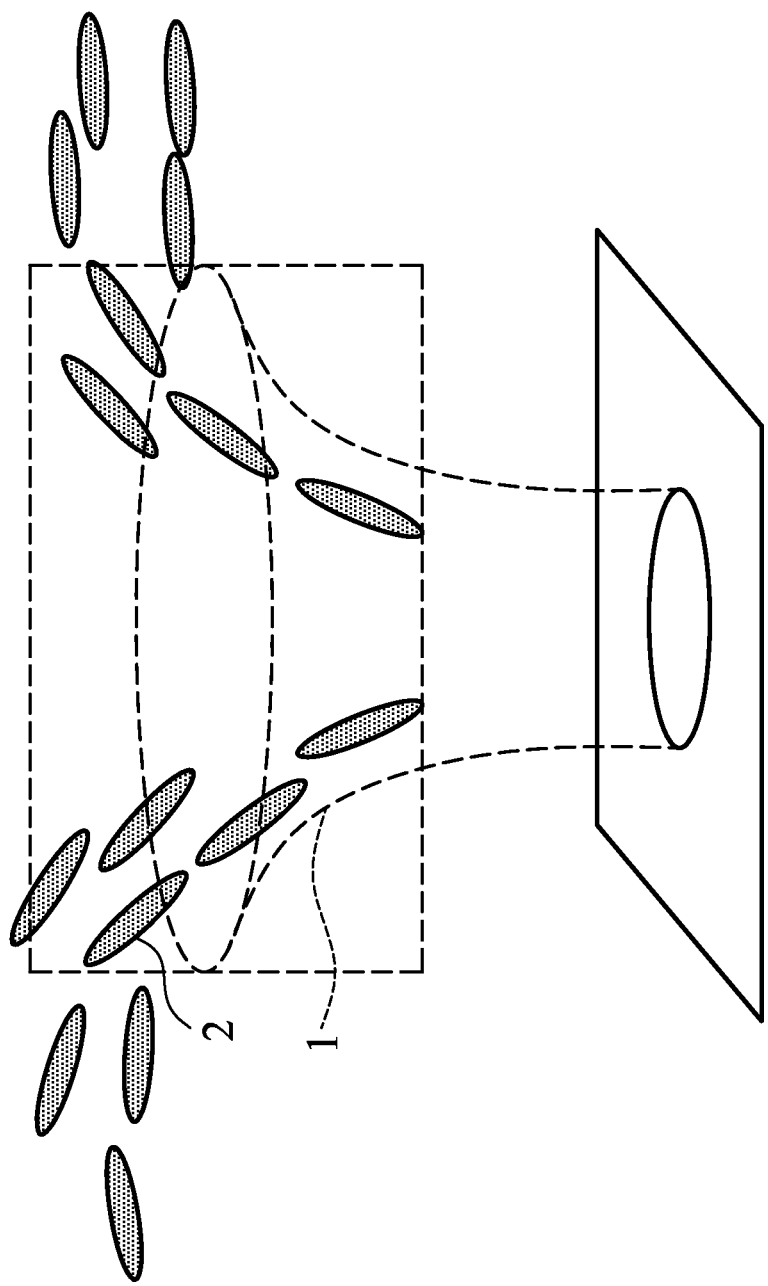
FIGS. 1A and 1B shows an element substrate of a conventional liquid crystal display.
Figure 1B:
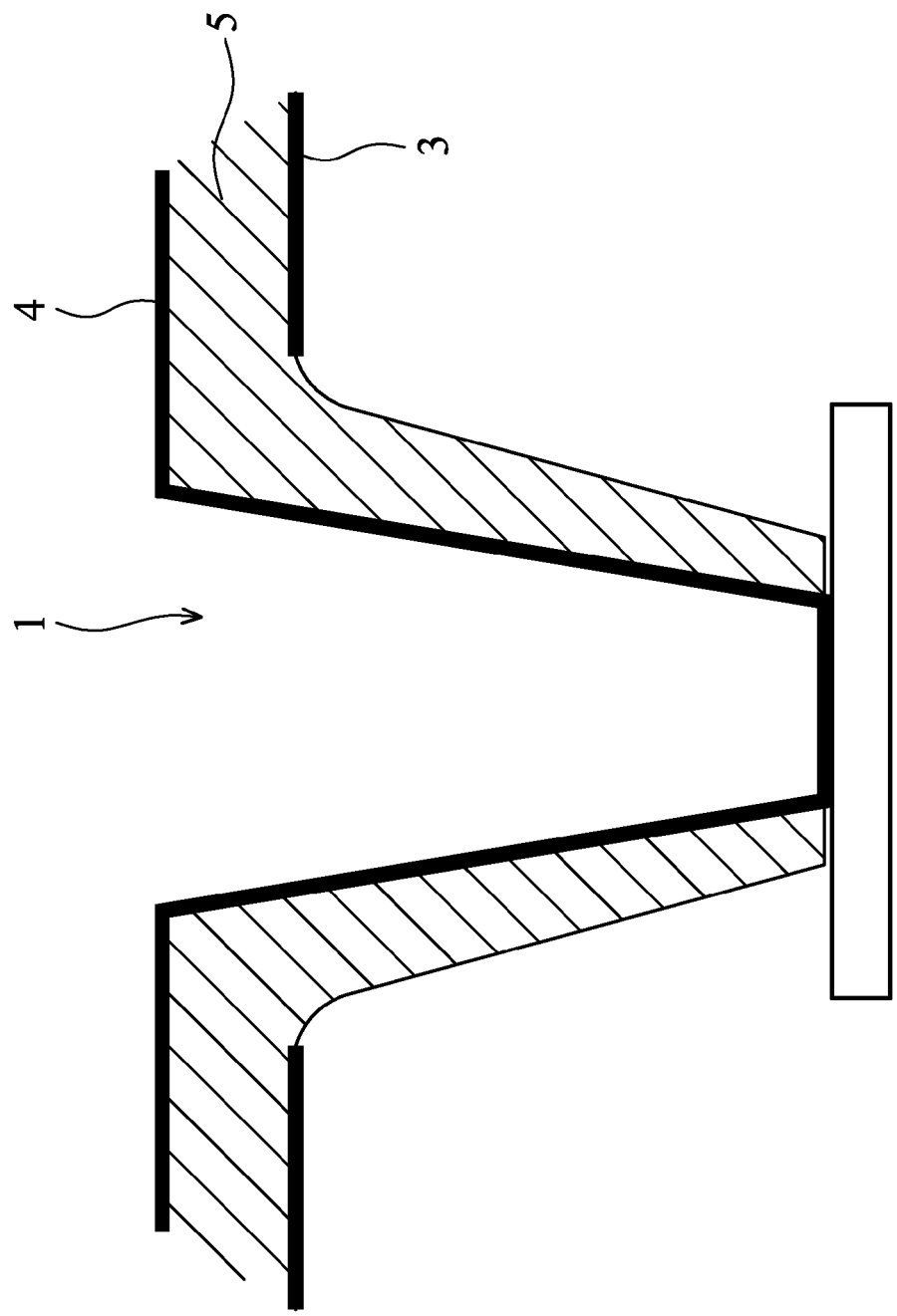
Figure 2A:
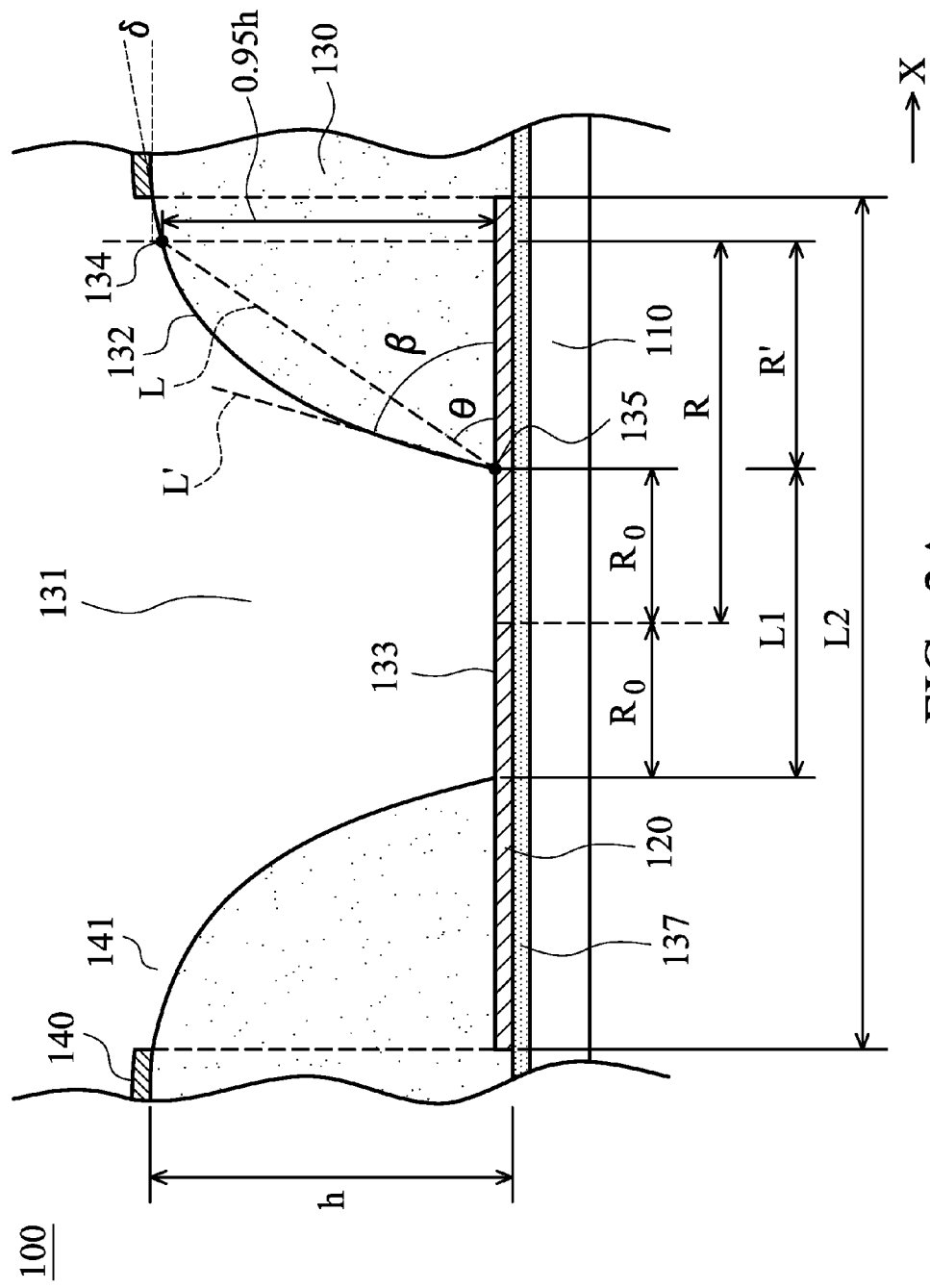
FIG. 2A shows the structure of an element substrate of an embodiment of the invention.

FIG. 2A shows an element substrate 100 of an embodiment of the invention, which comprises a substrate 110, a metal layer 120, a planarization layer 130 and a first conductive layer 140. The metal layer 120 is disposed on the substrate 110. The planarization layer 130 is located on the metal layer 120, wherein the planarization layer 130 comprises a top, a bottom, and a contact hole 131, the contact hole 131 has a continuous wall 132 and a hole bottom, the hole bottom of the contact hole 131 exposes the metal layer 120, and the hole bottom of the contact hole 131 has a first width $L_1$. The first conductive layer 140 is located on the planarization layer 130, wherein the first conductive layer 140 comprises an opening 141, the opening 141 exposes the contact hole 131, and the opening 141 has a second width $L_2$ above the contact hole 131.

With reference to FIG. 2A, the applicant has discovered from deriving curve equations that when the first width $L_1$ and the second width $L_2$ satisfy the following equation, the transmittance loss of the liquid crystal display is less than 1% (acceptable for the qualified liquid crystal), and the problems of contact short and insufficient capacitance are solved:

$$2*\left\{\frac{L_1}{2}+\frac{0.95h}{\ln(0.05)\cdot\tan(1.5\theta)}\cdot\ln\left[\frac{-0.134}{\ln(0.05)\cdot\tan(1.5\theta)}\right]\right\}\le$$
$$L_2\le 2*\left\{\frac{L_1}{2}+\frac{0.95h}{\ln(0.05)\cdot\tan(1.5\theta)}\cdot\ln\left[\frac{-0.00166}{\ln(0.05)\cdot\tan(1.5\theta)}\right]\right\}$$

wherein $L_1$ is the first width, $L_2$ is the second width, h is a thickness of the planarization layer 130 to the bottom of the planarization layer 130, θ is an included angle between a straight line and an extension surface of the bottom of the planarization layer, the straight line connects a reference point 134 and a base point 135, and the reference point 134 is located on the continuous wall 132, wherein a vertical distance from the reference point 134 to the hole bottom 133 of the contact hole 131 is 0.95 h, and the base point 135 is located at the point where the continuous wall 132 is connected to the bottom 133 of the contact hole 131. By modifying the parameters above, the curvature and the shape of the continuous wall 132 can be modified.

With reference to FIG. 2A, the derivative of the curve equation is presented in the following description.

First, curve fitting, assuming a curve equation of the continuous wall of the contact hole is:

$$y=f(R)=-A'\exp(-R) \quad (1)$$

Next, the curve fitting (relative to reference point 134, base point 135 and included angle θ), assuming that a distance between the reference point 134 and the top of the planarization layer 130 is p (p=0.05) times the thickness h of the planarization layer 130, then the curve equation of the continuous wall of the contact hole satisfies:

$$f(r) = -h\exp\left(\frac{-r}{\alpha}\right)$$

The horizontal distance between the reference point 134 and the base point 135 is R'. When the curve passes through the reference point 134, that means f(r=R'), the following two equations are satisfied:

$$f(R') = -ph = -h\exp\left(\frac{-R'}{\alpha}\right)$$

$$\tan\theta = \frac{(1-p)h}{R'}$$

Next, an included angle β between a cut line L' at base point 135 and the horizontal line defines the angle of the curve of the planarization layer 130, and the included angle β substantially equals 1.5θ. Therefore, by revising the curve equation (angle revising) further, we get:

$$f(r) = -h \cdot \exp\{-r/\alpha\} = h \cdot \exp\left\{r \cdot \frac{\ln(0.05) \cdot \tan(\beta)}{0.95h}\right\}$$
$$= -h \cdot \exp\left\{r \cdot \frac{\ln(0.05) \cdot \tan(1.5\theta)}{0.95h}\right\}$$

The curve equation of the contact hole is achieved.

Next, by bringing this equation into the above equation (moving the base point to the center of the contact hole 131), we get:

$$\because r = R - R_0 \ldots \text{(displacement)}$$

$$\Rightarrow f(r) = -h \cdot \exp\{-(R-R_0)/\alpha\}$$
$$= -h \cdot \exp\left\{(R-R_0) \cdot \frac{\ln(0.05) \cdot \tan(1.5\theta)}{0.95h}\right\}$$

The actual curve equation of the contact hole is achieved.

Next, the radius of the opening of the first conductive layer 140 should be deduced. The first conductive layer 140 is commonly located on a planar area of the planarization layer 130. Because the planar area of the planarization layer 130 is not perfectly planar, the tilt angle of the liquid crystal molecule is about 0.1°, and δ=0.1° is the inferior limit of the acceptable tilt angle.

$$\frac{\partial f(R')}{\partial R'} = \tan\delta = \frac{\partial}{\partial R'}\left\{-h \cdot \exp\left[R' \cdot \frac{\ln(0.05) \cdot \tan(1.5\theta)}{0.95h}\right]\right\}$$

$$\Rightarrow -h \cdot \exp\left[R' \cdot \frac{\ln(0.05) \cdot \tan(1.5\theta)}{0.95h}\right] \cdot \frac{\partial}{\partial R'}\left[R' \cdot \frac{\ln(0.05) \cdot \tan(1.5\theta)}{0.95h}\right] = \tan\delta$$

$$\Rightarrow \exp\left[R' \cdot \frac{\ln(0.05) \cdot \tan(1.5\theta)}{0.95h}\right] = \frac{-0.95 \cdot \tan\delta}{\ln(0.05) \cdot \tan(1.5\theta)}$$

$$\Rightarrow R' \cdot \frac{\ln(0.05) \cdot \tan(1.5\theta)}{0.95h} = \ln\left[\frac{-0.95 \cdot \tan\delta}{\ln(0.05) \cdot \tan(1.5\theta)}\right]$$

$$\Rightarrow R' = \frac{0.95h}{\ln(0.05) \cdot \tan(1.5\theta)} \cdot \ln\left[\frac{-0.95 \cdot \tan\delta}{\ln(0.05) \cdot \tan(1.5\theta)}\right]$$

$$\Rightarrow R = R_0 + \frac{0.95h}{\ln(0.05) \cdot \tan(1.5\theta)} \cdot \ln\left[\frac{-0.95 \cdot \tan\delta}{\ln(0.05) \cdot \tan(1.5\theta)}\right]$$

The radius of the opening of the first conductive layer 140 is achieved.

Only considering the tilt angle without considering the twisting angle of the liquid crystal panel, the transparent ratio of the liquid crystal panel satisfies the following equation: $T \propto \sin^2(\Gamma)$, wherein Γ is a phase retardation angle, T is the transparent ratio of the liquid crystal panel, and the transparent ratio of the liquid crystal panel is directly proportionate with a sine square function. When the tilt angle is between 0.1 and 8 degrees, the illumination loss is less than 1%, which is acceptable for qualified liquid crystal display. According to the parameters above, the following function is achieved:

$$2 * \left\{\frac{L_1}{2} + \frac{0.95h}{\ln(0.05) \cdot \tan(1.5\theta)} \cdot \ln\left[\frac{-0.134}{\ln(0.05) \cdot \tan(1.5\theta)}\right]\right\} \leq$$
$$L_2 \leq 2 * \left\{\frac{L_1}{2} + \frac{0.95h}{\ln(0.05) \cdot \tan(1.5\theta)} \cdot \ln\left[\frac{-0.00166}{\ln(0.05) \cdot \tan(1.5\theta)}\right]\right\}$$

In one embodiment, the included angle θ is between 20 and 40 degrees, such as between 25 and 35 degrees.

With reference to FIG. 2A, in one embodiment, the metal layer 120 is a source electrode or a drain electrode of a driving element. In one embodiment, the element substrate 100 further comprises a semiconductor layer 137 located between the metal layer 120 and the substrate 110. The semiconductor layer 137 can be made of polycrystalline silicon, amorphous silicon or metal oxide.

Figure 2B:
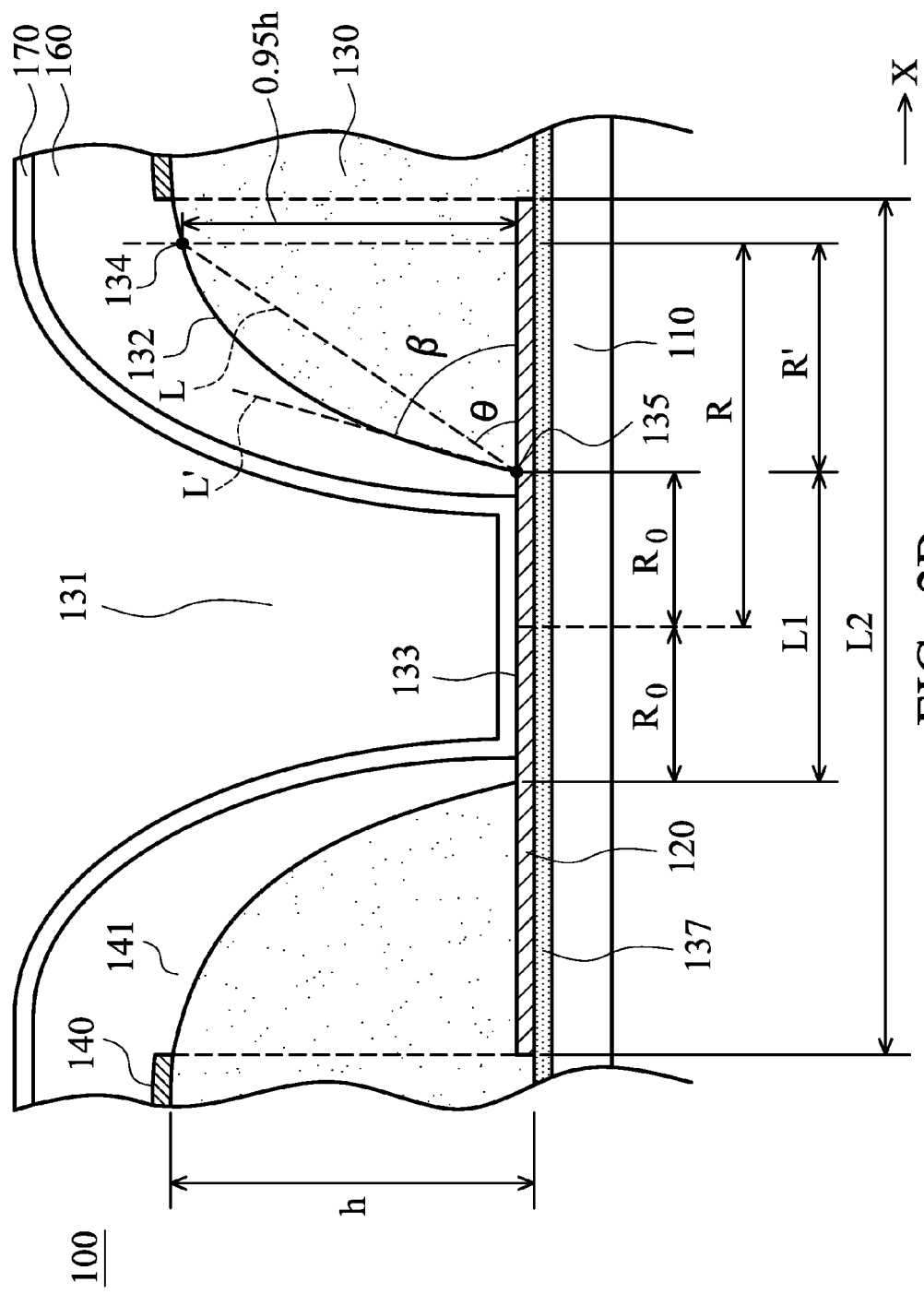
FIG. 2B shows the detailed structure of the element substrate of the embodiment of the invention.

With reference to FIG. 2B, in one embodiment, the element substrate 100 further comprises an insulation layer 160 and a second conductive layer 170, wherein at least a portion of the insulation layer 160 is disposed between the first conductive layer 140 and the second conductive layer 170, and the second conductive layer 170 is electrically connected to the metal layer 120 via the contact hole 131.

Figure 3A:
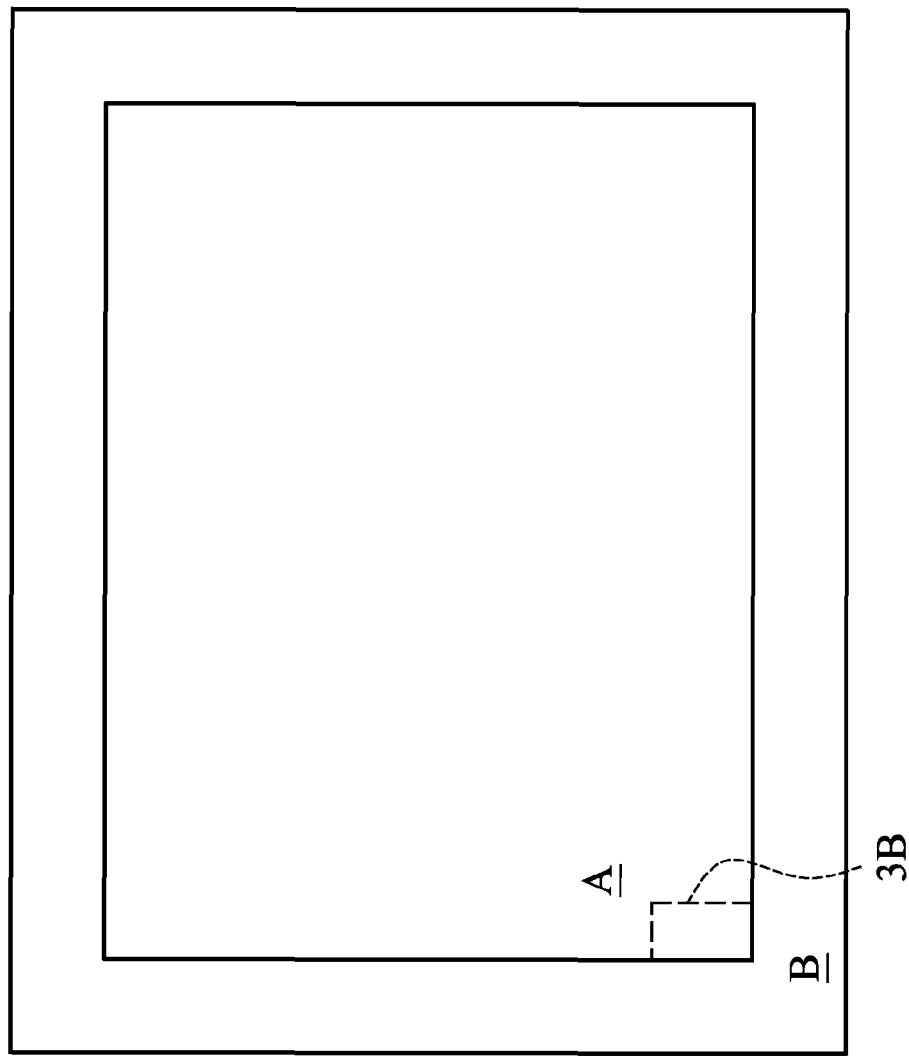
FIG. 3A shows the element substrate of the embodiment of the invention utilized in a liquid crystal display.
Figure 3B:
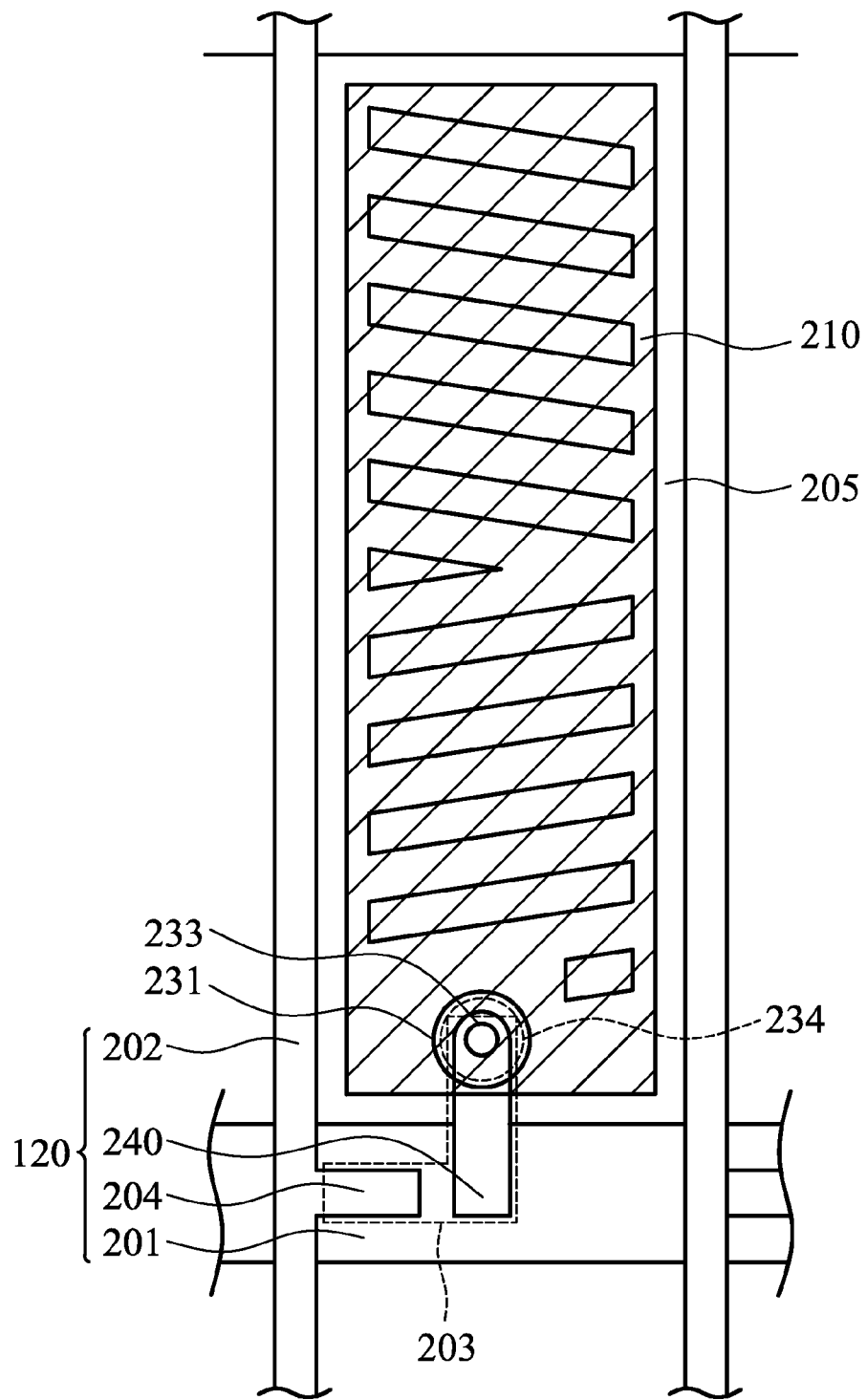
FIG. 3B shows detailed elements in portion 3B of FIG. 3A.

FIG. 3A shows the element substrate of the embodiment of the invention utilized in a liquid crystal display 200 which comprises an active area (pixel area) A and an non-active area (B). FIG. 3B shows detailed structures of portion 3B of FIG. 3A, wherein the liquid crystal display 200 further comprises scan lines 201, data lines 202, a semiconductor layer 203, source electrodes 240, a contact hole 231 (equivalent to the contact hole 131 of FIG. 2A), a bottom 233 of the contact hole (equivalent to the bottom 133 of FIG. 2A), a common electrode opening 234 (equivalent to the opening 141 of FIG. 2A), drain electrodes 204, common electrodes 205 and pixel electrodes 210, which are located in the active area A. In an embodiment of the invention, the metal layer 120 comprises the source electrodes 240 and the drain electrodes 204. The liquid crystal display can be a fringe field switching display or in-place switching display.

Figure 4:
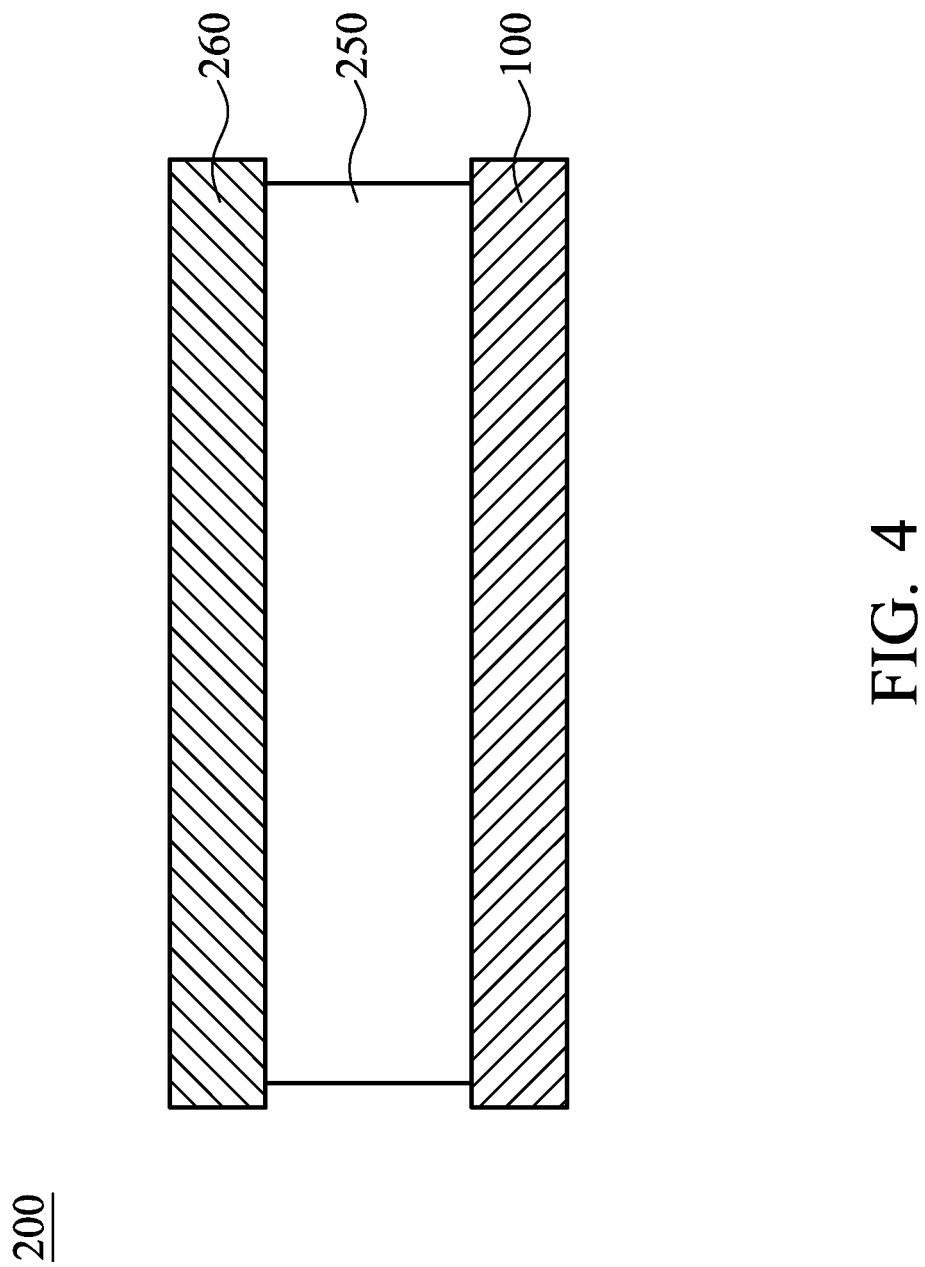
FIG. 4 shows a liquid crystal display of an embodiment of the invention.

FIG. 4 shows a liquid crystal display 200 of an embodiment of the invention, which comprises an opposite substrate 260, a liquid crystal layer 250 and the element substrate 100.

Utilizing the embodiment of the invention, the illumination loss of the liquid crystal display is less than 1%, which is acceptable for the qualified liquid crystal display, and the problems of contact short and insufficient capacitance between the first conductive layer 140 and the second conductive layer 170 are solved.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An element substrate, comprising:
   a substrate;
   a metal layer, disposed on the substrate;
   a planarization layer, located on the metal layer, wherein the planarization layer comprises a top surface, a bottom surface, and a contact hole, wherein the contact hole has a curved continuous wall and a hole bottom, the curved continuous wall disposed between the top surface of the planarization layer and the bottom surface of the planarization layer, the hole bottom of the contact hole exposes the metal layer, and the hole bottom of the contact hole has a first width;
   a first conductive layer, located on the top surface of the planarization layer, wherein the first conductive layer comprises an opening, the opening exposes the contact hole, and the opening has a second width;
   wherein the first width and the second width satisfy the following equation:

$$2*\left\{\frac{L_1}{2} + \frac{0.95h}{\ln(0.05)\cdot\tan(1.5\theta)} \cdot \ln\left[\frac{-0.134}{\ln(0.05)\cdot\tan(1.5\theta)}\right]\right\} \leq$$
$$L_2 \leq 2*\left\{\frac{L_1}{2} + \frac{0.95h}{\ln(0.05)\cdot\tan(1.5\theta)} \cdot \ln\left[\frac{-0.00166}{\ln(0.05)\cdot\tan(1.5\theta)}\right]\right\}$$

wherein $L_1$ is the first width, $L_2$ is the second width, h is a thickness of the planarization layer from the top surface to the bottom surface, and $\theta$ is an included angle between a straight line and an extension surface of the hole bottom, wherein L1, L2 and h are values of micrometer units and $\theta$ is an angle type of degrees (°), wherein the straight line connects a reference point and a base point, wherein the base point is located at a point where the curved continuous wall is connected to the hole bottom of the contact hole, wherein the reference point is located on the curved continuous wall, the reference point is adjacent to an end of the first conductive layer, and a vertical distance from the reference point to the hole bottom is 0.95 h, and wherein an interval is located between the reference point and the end of the first conductive layer which is adjacent to the reference point.

2. The element substrate as claimed in claim 1, wherein the included angle $\theta$ is between 20 and 40 degrees.

3. The element substrate as claimed in claim 2, wherein the included angle $\theta$ is between 25 and 35 degrees.

4. The element substrate as claimed in claim 1, further comprising an insulation layer and a second conductive layer, wherein at least a portion of the insulation layer is disposed between the first conductive layer and the second conductive layer, and the second conductive layer is electrically connected to the metal layer via the contact hole.

5. The element substrate as claimed in claim 1, wherein the metal layer is a source electrode or a drain electrode of a driving element.

6. The element substrate as claimed in claim 1, further comprising a semiconductor layer located between the metal layer and the substrate.

7. The element substrate as claimed in claim 6, wherein the semiconductor layer is made of polycrystalline silicon, amorphous silicon or metal oxide.

8. A liquid crystal display, comprising:
   an opposite substrate;
   an element substrate, facing the opposite substrate;
   a liquid crystal layer disposed between the opposite substrate and the element substrate, wherein the element substrate comprises:
   a substrate;
   a metal layer, disposed on the substrate;
   a planarization layer, located on the metal layer, wherein the planarization layer comprises a top surface, a bottom surface, and a contact hole, wherein the contact hole has a curved continuous wall and a hole bottom, the curved continuous wall disposed between the top surface of the planarization layer and the bottom surface of the planarization layer, the hole bottom of the contact hole exposes the metal layer, and the hole bottom of the contact hole has a first width;
   a first conductive layer, located on the top surface of the planarization layer, wherein the first conductive layer comprises an opening, the opening exposes the contact hole, and the opening has a second width;
   wherein the first width and the second width satisfy the following equation:

$$2*\left\{\frac{L_1}{2} + \frac{0.95h}{\ln(0.05)\cdot\tan(1.5\theta)} \cdot \ln\left[\frac{-0.134}{\ln(0.05)\cdot\tan(1.5\theta)}\right]\right\} \leq$$
$$L_2 \leq 2*\left\{\frac{L_1}{2} + \frac{0.95h}{\ln(0.05)\cdot\tan(1.5\theta)} \cdot \ln\left[\frac{-0.00166}{\ln(0.05)\cdot\tan(1.5\theta)}\right]\right\}$$

wherein $L_1$ is the first width, $L_2$ is the second width, h is a thickness of the planarization layer from the top surface to the bottom surface, and θ is an included angle between a straight line and an extension surface of the hole bottom, wherein L1, L2 and h are values of micrometer units and θ is an angle type of degrees (°), wherein the straight line connects a reference point and a base point, wherein the base point is located at a point where the curved continuous wall is connected to the hole bottom of the contact hole, wherein the reference point is located on the curved continuous wall, the reference point is adjacent to an end of the first conductive layer, and a vertical distance from the reference point to the hole bottom is 0.95 h, and wherein an interval is located between the reference point and the end of the first conductive layer which is adjacent to the reference point.

9. The liquid crystal display as claimed in claim 8, wherein the included angle θ is between 20 and 40 degrees.

10. The liquid crystal display as claimed in claim 9, wherein the included angle θ is between 25 and 35 degrees.

11. The liquid crystal display as claimed in claim 8, further comprising an insulation layer and a second conductive layer, wherein at least a portion of the insulation layer is disposed between the first conductive layer and the second conductive layer, and the second conductive layer is electrically connected to the metal layer via the contact hole.

12. The liquid crystal display as claimed in claim 11, wherein the metal layer is a source electrode or a drain electrode of a driving element.

13. The liquid crystal display as claimed in claim 12, further comprising a semiconductor layer located between the metal layer and the substrate.

14. The liquid crystal display as claimed in claim 13, wherein the semiconductor layer is made of polycrystalline silicon, amorphous silicon or metal oxide.

* * * * *